United States Patent
Göötz et al.

(10) Patent No.: US 9,985,011 B2
(45) Date of Patent: May 29, 2018

(54) METHOD FOR PRODUCING AN OPTOELECTRONIC SEMICONDUCTOR CHIP

(71) Applicant: OSRAM Opto Semiconductors GmbH, Regensburg (DE)

(72) Inventors: Britta Göötz, Regensburg (DE); Ion Stoll, Tegernheim (DE); Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days. days.

(21) Appl. No.: 14/912,382

(22) PCT Filed: Aug. 8, 2014

(86) PCT No.: PCT/EP2014/067098
§ 371 (c)(1),
(2) Date: Feb. 16, 2016

(87) PCT Pub. No.: WO2015/024801
PCT Pub. Date: Feb. 26, 2015

(65) Prior Publication Data
US 2016/0190110 A1 Jun. 30, 2016

(30) Foreign Application Priority Data
Aug. 21, 2013 (DE) .................. 10 2013 109 031

(51) Int. Cl.
*H01L 21/00* (2006.01)
*H01L 25/16* (2006.01)
(Continued)

(52) U.S. Cl.
CPC ............ *H01L 25/167* (2013.01); *C25D 13/02* (2013.01); *C25D 13/22* (2013.01); *H01L 27/156* (2013.01);
(Continued)

(58) Field of Classification Search
CPC ..... H01L 27/156; H01L 33/42; H01L 25/167; H01L 33/502
See application file for complete search history.

(56) References Cited

U.S. PATENT DOCUMENTS 6,924,233 B1 8/2005 Chua et al.
7,932,529 B2 4/2011 Lin et al.
(Continued)

FOREIGN PATENT DOCUMENTS

CN 101661979 A 3/2010
DE 102011111980 A1 2/2013
(Continued)

OTHER PUBLICATIONS

Belton, C.R. et al., "New light from hybrid inorganic-organic emitters," Journal of Physics D: Applied Physics, vol. 11, Apr. 4, 2008, 12 pages.

*Primary Examiner* — Bradley K Smith
(74) *Attorney, Agent, or Firm* — Slater Matsil, LLP

(57) ABSTRACT

A method for producing an optoelectronic semiconductor chip is disclosed. A semiconductor body has a pixel area, which has at least two different subpixel areas. An electrically conductive layer is applied to the radiation outlet surface of at least one subpixel area. The electrically conductive layer is designed to at least partially salify with a protic reaction partner. A conversion layer is deposited onto the electrically conductive layer by means of a electrophoresis process.

20 Claims, 10 Drawing Sheets

(51) Int. Cl.
    *C25D 13/02*     (2006.01)
    *C25D 13/22*     (2006.01)
    *H01L 27/15*     (2006.01)
    *H01L 33/42*     (2010.01)
    *H01L 33/50*     (2010.01)
    *H01L 33/56*     (2010.01)

(52) U.S. Cl.
    CPC ............ *H01L 33/42* (2013.01); *H01L 33/502* (2013.01); *H01L 33/504* (2013.01); *H01L 33/56* (2013.01); *H01L 2924/0002* (2013.01); *H01L 2933/005* (2013.01); *H01L 2933/0016* (2013.01); *H01L 2933/0041* (2013.01)

(56) References Cited

U.S. PATENT DOCUMENTS

| | | |
|---|---|---|
| 8,273,589 B2 | 9/2012 | Watkins |
| 8,288,787 B2 * | 10/2012 | Yoo .................. H01L 33/44 257/103 |
| 8,394,654 B2 * | 3/2013 | Aliyev ................ C25D 7/00 204/600 |
| 8,865,493 B2 | 10/2014 | Kelley et al. |
| 2002/0187571 A1 | 12/2002 | Collins, III et al. |
| 2007/0045761 A1 | 3/2007 | Basin et al. |
| 2007/0158668 A1 | 7/2007 | Tarsa et al. |
| 2009/0108269 A1 | 4/2009 | Negley et al. |
| 2010/0252844 A1 | 10/2010 | Komada |
| 2012/0205695 A1 * | 8/2012 | Lin .................. H01L 33/44 257/98 |
| 2014/0231855 A1 * | 8/2014 | Stoll ................ H01L 33/504 257/98 |
| 2014/0346548 A1 | 11/2014 | Beppu et al. |
| 2015/0207043 A1 | 7/2015 | Pfeuffer et al. |
| 2015/0255683 A1 | 9/2015 | Stoll et al. |

FOREIGN PATENT DOCUMENTS

| | | |
|---|---|---|
| DE | 102012105691 A1 | 1/2014 |
| DE | 102012106859 A1 | 1/2014 |
| DE | 102012108704 A1 | 3/2014 |
| EP | 1267424 A2 | 12/2002 |
| EP | 2105976 A2 | 9/2009 |
| JP | 2008066365 A | 3/2008 |
| JP | 2011501466 A | 1/2011 |
| JP | 2012514335 A | 6/2012 |
| JP | 2012256848 A | 12/2012 |
| JP | 2013522916 A | 6/2013 |

\* cited by examiner

METHOD FOR PRODUCING AN OPTOELECTRONIC SEMICONDUCTOR CHIP

This patent application is a national phase filing under section 371 of PCT/EP2014/067098, filed Aug. 8, 2014, which claims the priority of German patent application 10 2013 109 031.1, filed Aug. 21, 2013, each of which is incorporated herein by reference in its entirety.

TECHNICAL FIELD

A method is provided for producing an optoelectronic semiconductor chip.

BACKGROUND

A method involves depositing a conversion layer electrophoretically on a semiconductor body. A method for applying a conversion layer is described, for example, in the paper by C. R. Belton et al., J. Phys. D.: Appl. Phys. 41, 094006 (2008).

SUMMARY

In the present case, embodiments provide a method that makes it possible to apply a conversion layer to comparatively small subpixel regions to produce different colors.

In the method for producing a semiconductor chip, a semiconductor body with a pixel region is provided. The pixel region comprises at least two different subpixel regions. The subpixel regions are preferably electrically insulated from one another. Each subpixel region preferably comprises an active layer, which is suitable for emitting electromagnetic radiation of a first wavelength range when the semiconductor body is in operation. The first wavelength range particularly preferably comprises blue light or is formed from blue light.

The subpixel regions, for example, have a side length of at most 150 micrometers. The subpixel regions may be separated from one another, for example, by trenches. The subpixel regions are, for example, arranged at a distance from one another. For example, the distance between two directly adjacent subpixel regions has a value which is no greater than 10 micrometers.

Furthermore, an electrically conductive layer is applied to the radiation exit face of at least one subpixel region. The electrically conductive layer is suitable at least in part for forming a salt with a protic reactant.

Particularly preferably, the electrically conductive layer comprises a metal, a metal alloy, a semimetal or a semiconductor material or is formed of a metal, a semimetal or a semiconductor material. For example, the electrically conductive layer comprises one of the following materials or is formed of one of the following materials: lithium, sodium, potassium, rubidium, caesium, beryllium, calcium, magnesium, strontium, barium, scandium, titanium, aluminum, silicon, gallium, tin, zirconium, zinc oxide, zinc sulfide, zinc selenide, zinc telluride or tin oxide.

The electrically conductive layer particularly preferably has a thickness of between 20 nanometers and 20 micrometers inclusive. For example, the electrically conductive layer has a thickness of between 20 nanometers and 300 nanometers inclusive. Particularly preferably, the electrically conductive layer has a thickness of between 20 nanometers and 100 nanometers inclusive.

The electrical layer preferably has an electrical conductivity of at least 1 Siemens/meter. The conductivity of the electrically conductive layer may also be increased by doping. Such electrical conductivity advantageously allows sufficient charge transport even with comparatively thin electrically conductive layers, which have a thickness for instance of between 20 nanometers and 300 nanometers inclusive or between 20 nanometers and 100 nanometers inclusive.

The electrically conductive layer may, for example, be deposited by thermal vapor deposition or sputtering.

A conversion layer is deposited on the electrically conductive layer by an electrophoresis process. The conversion layer is suitable for converting electromagnetic radiation of the first wavelength range into radiation of a second wavelength range. In other words, the conversion layer is configured to convert wavelengths.

The phrase "to convert wavelengths" is here in particular intended to mean that irradiated electromagnetic radiation of a given wavelength range is converted into electromagnetic radiation of another, preferably longer-wave, wavelength range. As a rule, a wavelength-converting element absorbs electromagnetic radiation of an irradiated wavelength range, converts it by electronic processes at atomic and/or molecular level into electromagnetic radiation of another wavelength range and re-emits the converted electromagnetic radiation.

The conversion layer generally comprises particles of a luminescent material, which lend the conversion layer the wavelength-converting properties.

One of the following materials is, for example, suitable for the luminescent material particles: rare earth metal-doped garnets, rare earth metal-doped alkaline earth sulfides, rare earth metal-doped thiogallates, rare earth metal-doped aluminates, rare earth metal-doped silicates, rare earth metal-doped orthosilicates, rare earth metal-doped chlorosilicates, rare earth metal-doped alkaline earth silicon nitrides, rare earth metal-doped oxynitrides, rare earth metal-doped aluminum oxynitrides, rare earth metal-doped silicon nitrides or rare earth metal-doped sialons.

Comparatively small luminescent material particles are particularly preferably used in the present method to coat the comparatively small subpixel regions. Particularly preferably, the diameter of the luminescent material particles does not exceed a value of 5 micrometers.

In an electrophoresis process the particles, for example, of the luminescent material, to be applied are accelerated by an electrical field, such that a layer of these particles is deposited on a surface provided. In general, the surface to be coated is provided in an electrophoresis bath, which contains the particles intended to form the conversion layer. In the electrophoresis process, the particles are deposited only on the parts of the surface which are electrically conductive. The particles are generally differently deposited depending on the electrical conductivity of these regions.

One concept of the present invention is to apply an electrically conductive layer to the surface to be coated and thus always to provide an identical surface for electrophoretic deposition.

One method for depositing an electrophoretic layer is described, for example, in document DE 102012105691.9, the disclosure content of which is hereby included by reference.

In a particularly preferred embodiment of the method, the electrically conductive layer is substantially chemically inert relative to an organic solvent of the electrophoresis bath. The term "chemically inert" should here be understood to mean that the electrically conductive layer does not undergo any significant chemical reaction with the organic solvent, wherein in reality a slight chemical reaction between two materials cannot as a rule be wholly ruled out.

For example, the electrophoresis bath contains as organic solvent one of the following substances: alcohol, ketone, aromatic or aldehyde.

According to one embodiment of the method, the luminescent material particles of the conversion layer, which is produced by electrophoresis, are fixed by a bonding agent after the electrophoresis process. The bonding agent may, for example, comprise a silicone or an epoxide or a mixture of these materials. Other suitable materials or coatings may also be used as the bonding agent.

According to one embodiment, each subpixel region comprises a radiation exit face, which is electrically conductive. For example, the radiation exit face of each subpixel region is here formed by a transparent electrically conductive layer. The transparent electrically conductive layer is particularly preferably formed by a TCO material or comprises a TCO material ("TCO"=transparent conductive oxide).

Transparent conductive oxides are as a rule metal oxides, such as, for example, zinc oxide, tin oxide, cadmium oxide, titanium oxide, indium oxide or indium-tin oxide (ITO). In addition to binary metal-oxygen compounds, such as, for example, $ZnO$, $SnO_2$ or $In_2O_3$, ternary metal-oxygen compounds, such as, for example, $Zn_2SnO_4$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, TCOs do not necessarily correspond to a stoichiometric composition and may moreover also be p- as well as n-doped.

An electrically conductive layer is then applied to the radiation exit face of at least one subpixel region, wherein the radiation exit face of a further subpixel region is free of the electrically conductive layer.

According to one embodiment of the method, in electrophoretic deposition of the conversion layer the subpixel region onto which the conversion layer is applied is energized independently of the other subpixel regions. In this way, the conversion layer may be applied locally only on the precise subpixel region being energized, while the other subpixel regions to which current is not supplied remain free of the conversion layer.

If the subpixel regions may be individually energized at the time of deposition of the conversion layer and if the radiation exit face thereof is electrically conductive, it is particularly simple to provide the semiconductor body with a conversion layer and in particular it is particularly simple to provide different subpixel regions with different conversion layers.

If the radiation exit faces of each subpixel region are electrically conductive and if it is not possible or is possible only with difficulty to supply the subpixel regions individually with current, then according to a further embodiment of the method the electrically conductive layer is applied over the entire surface of the front of the semiconductor body. A photoresist layer is then applied onto the electrically conductive layer in at least one subpixel region, while the electrically conductive layer in a further subpixel region is freely accessible. The electrophoresis process is then performed and the conversion layer deposited as a rule over the entire surface. To this end, the electrically conductive layer is preferably in each case electrically contacted laterally. Since the photoresist layer comprises an electrically insulating surface, in the electrophoresis process the luminescent material particles are deposited only on the regions of the electrically conductive layer which are freely accessible. After completion of the electrophoresis process the photoresist layer is removed again.

It is then possible once again to apply a photoresist layer, leaving the electrically conductive layer of another subpixel region free. In a subsequent electrophoresis process, a further conversion layer is then deposited on the freely accessible electrical layer. The further conversion layer is in this case preferably suitable for converting electromagnetic radiation of the first wavelength range into electromagnetic radiation of a third wavelength range different from the first and second wavelength ranges.

It is moreover also possible for the surface of the subpixel regions of the semiconductor body firstly to be formed by a passivation layer. The passivation layer is, for example, electrically insulating and provided to protect the semiconductor body from external influences. For example, the passivation layer is formed from an oxide or a nitride or comprises one of these materials. As a rule, the passivation layer is applied over the entire surface of a front of the semiconductor body. The front of the semiconductor body here comprises the radiation exit faces of the subpixel regions.

According to one embodiment of the method, an electrically conductive radiation exit face is provided by removing the passivation layer which has been applied to the subpixel region.

Furthermore, it is also possible for the passivation layer to remain on the front of the semiconductor body and thus on the radiation exit faces of the subpixel regions. In this embodiment of the method, the electrically conductive layer is applied to the entire surface of the front of the semiconductor body. In a next step, a photoresist layer is applied to the electrically conductive layer in at least one subpixel region, while the electrically conductive layer is freely accessible in a further subpixel region.

Particularly preferably, an electrically conductive layer applied over the entire surface is electrically contacted laterally during the electrophoresis process.

If a semiconductor body is provided in which the radiation exit face of each subpixel region is formed by a passivation layer, the passivation layer may also be removed from the radiation exit face of the subpixel region, such that the radiation exit face is made electrically conductive, while the passivation layer is retained on the radiation exit face of at least one subpixel region. The electrically conductive layer is then applied onto the electrically conductive radiation exit face, while the radiation exit faces of the subpixel regions, which are formed by passivation, remain free of the electrically conductive layer. The conversion layer is then applied onto the electrically conductive layer using an electrophoresis process.

The conversion layer is in this case applied only onto the regions from which passivation has been previously removed, the rest of the surface remaining free of the conversion layer, since the latter is not electrically conductive.

In this embodiment of the method, the steps described in the above paragraph for applying a further conversion layer onto a further subpixel region are preferably repeated. To this end, the passivation layer is removed in the region of the radiation exit face of a further subpixel region and the electrically conductive layer is applied to this exposed region. The further conversion layer is then applied onto the electrically conductive layer using a further electrophoresis process. The further conversion layer is in this case suitable for converting electromagnetic radiation of the first wavelength range into electromagnetic radiation of a third wavelength range different from the first and second wavelength ranges.

Each pixel region preferably comprises precisely three subpixel regions. For example, one of the three subpixel regions is provided to emit green light, while a further subpixel region is provided to produce red light and the third subpixel region is intended to emit blue light. If the first wavelength range for example comprises blue light, one subpixel region is in this case particularly preferably free of a conversion layer. A further subpixel region preferably comprises a conversion layer which is suitable for converting electromagnetic radiation of the first, blue wavelength range into electromagnetic radiation of a second wavelength range, wherein the second wavelength range preferably comprises green light or consists of green light. The third subpixel region preferably comprises a further conversion layer which is suitable for converting blue radiation of the first wavelength range into radiation of a third wavelength range which particularly preferably comprises red light or consists of red light.

The conversion layer is particularly preferably configured such that it converts radiation of the first wavelength range as completely as possible into radiation of the second or third wavelength range.

According to one embodiment of the method, the electrically conductive layer is introduced into the protic reactant after the electrophoresis process, such that the electrically conductive layer at least in part forms a salt with the protic reactant. This offers the advantage that an electrically conductive layer converted at least in part into a salt is generally more transmissive for visible light than the electrically conductive layer itself. If the electrically conductive layer is thus applied on a radiation exit face, it has only a slightly preventive effect on light outcoupling from the radiation exit face after conversion into a salt. It is furthermore also possible to wash the salt as completely as possible back out of the finished component.

According to one embodiment of the method, the salt is washed at least in part out of the semiconductor chip.

In this case, the salt is particularly preferably removed from the surface of the semiconductor body.

The material M of the electrically conductive layer is in this case reacted generally as follows with a protic reactant of the general formula ROH:

$$M+ROH \rightarrow 4M(OR)+H_2$$

If the electrically conductive layer for example comprises aluminum, the aluminum forms a salt as follows with water as the protic reactant:

$$2Al+6H_2O \rightarrow 2AL(OH)_3+2H_2$$

The water acting as the protic reactant may in this case be present in the form of a liquid or in gaseous form as water vapor.

Alternatively, hydrochloric acid could for example also be used as the protic reactant for an aluminum-containing electrically conductive layer. Salt formation would then for example proceed according to the following scheme:

$$Al+HCl \rightarrow AlCl_3+H_2$$

If the electrically conductive layer for example comprises sodium, the sodium as a rule forms a salt as follows with water as the protic reactant:

$$2Na+4H_2O \rightarrow 2Na(OH)_2+2H_2$$

If the electrically conductive layer for example comprises silicon, the silicon as a rule forms a salt as follows with hydrochloric acid as the protic reactant:

$$Si+3HCl \rightarrow HSiCl_3+H_2$$

The chemical reaction between the material of the electrically conductive layer and the protic reactant may generally advantageously be accelerated by the addition of bases or alkalies. The chemical reaction between the material of the electrically conductive layer and the protic reactant may moreover proceed directly in the protic reactant or indeed also in an aprotic solvent, to which the protic reactant has been added in a corresponding amount.

According to one embodiment of the method, the protic reactant is contained in a liquid or a gas or is present as a liquid or as a gas.

For example, the protic reactant is water, an alcohol, a carboxylic acid, a mineral acid, an amine, an amide or a mixture of at least two such materials.

The electrophoretically applied conversion layer may comprise pores, through which the protic reactant in liquid or gaseous form, or indeed also the solvent may reach the electrically conductive layer or the salt formed to wash out the salt. In this way, the chemical reaction may proceed between the protic reactant and the electrically conductive layer. Furthermore, the salt formed may also diffuse into the solvent for the purpose of washing out.

BRIEF DESCRIPTION OF THE DRAWINGS

Further advantageous embodiments and further developments of the invention are revealed by the exemplary embodiments described below in connection with the figures.

Figure 1:
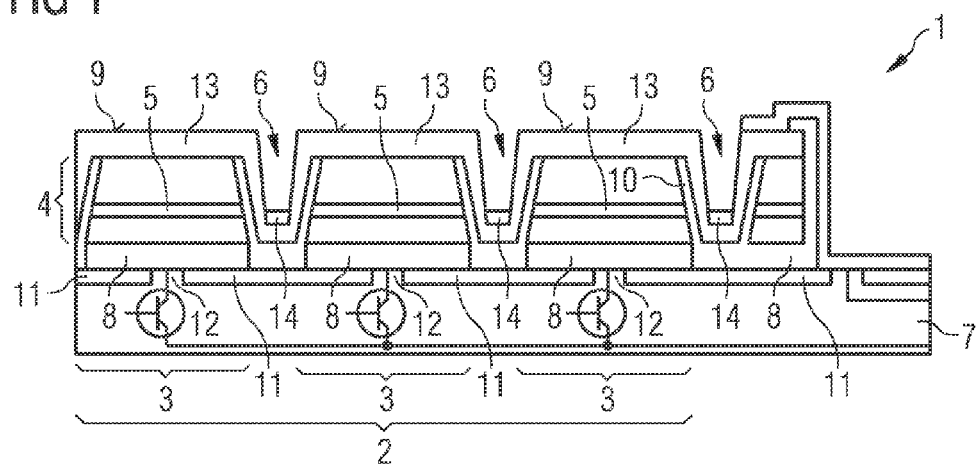
FIGS. 1 and 2 each show a schematic sectional representation of a semiconductor body in each case according to an exemplary embodiment, as may be provided in the case of a method described here.

A method according to a first exemplary embodiment is explained with reference to the schematic sectional representations of FIGS. 3 to 9.

A method according to a second exemplary embodiment is explained with reference to the schematic sectional representations of FIGS. 10 to 11.

A method according to a third exemplary embodiment is explained with reference to the schematic sectional representations of FIGS. 12 to 19.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

DETAILED DESCRIPTION OF ILLUSTRATIVE EMBODIMENTS

The semiconductor body 1 according to the exemplary embodiment in FIG. 1 comprises a pixel region 2 with three subpixel regions 3. Each subpixel region 3 comprises a semiconductor layer sequence 4 with an active layer 5 which is suitable for generating electromagnetic radiation of a first wavelength range. In the present case, the active layer 5 is suitable for producing visible blue light. Each two directly adjacent subpixel regions 3 are separated from one another by a trench 6. Each trench 6 passes right through the active layer 5. Furthermore, in the present case the trench 6 also passes right through the semiconductor layer sequence 4. In this way, the semiconductor layer sequence 4 of each subpixel region 3 forms a projection.

The semiconductor body 1 further comprises a carrier element 7 on which the pixel region 2 is arranged. Between the carrier element 7 and the semiconductor layer sequence 4 a specular layer 8 is arranged. The specular layer 8 is suitable for reflecting electromagnetic radiation generated in the active layer 5 towards a radiation exit face 9 of the subpixel region 3. Furthermore, the specular layer 8 is electrically conductive, such that each subpixel region 3 may be electrically contacted at the back via the carrier element 7. The carrier element 7 may for example be an active matrix element of a display.

A passivation layer 10 is applied to the side faces of the semiconductor layer sequence 4. In the present case, the passivation layer 10 completely covers the side faces of the semiconductor layer sequence 4. Furthermore, the passivation layer 10 is also formed in the trenches 6 between respectively adjacent subpixel regions 3. The passivation layer 10 extends from the radiation exit face 9 on the side face of the semiconductor layer sequence 4 over the trench 6 and the side face of the adjacent subpixel region 3 to the radiation exit face 9 thereof. The front, facing the radiation exit face 9, of the semiconductor layer sequence 4 of each subpixel region 3 is however free of the passivation layer 10.

On a major face of the carrier element 7 facing the semiconductor layer sequence 4, regions 11 are arranged which are electrically insulating. The electrically insulating regions 11 extend along the major face between two directly adjacent subpixel regions 3, while in the region of a subpixel region 3 they each have a recess 12 which is filled with an electrically conductive material of the carrier element 7. The electrically insulating regions 11 of the carrier element 7, in association with the passivation layer 10 on the side faces of the subpixel regions 3 and in the trenches 6, result in the subpixel regions 3 in each case being electrically insulated from one another. The recesses 12 between the electrically insulating regions 11 result in the subpixel regions 3 in each case being electrically contacted at the back.

Furthermore, the subpixel regions 3 comprise a transparent electrically conductive layer 13 on their radiation exit faces 9, via which the subpixel regions 3 are electrically contacted at the front. The transparent electrically conductive layer 13 is here applied over the entire surface of a front of the pixel region 2 which comprises the radiation exit faces 9 of the subpixel regions 3. In the present exemplary embodiment, the transparent electrically conductive layer 13 completely covers the radiation exit faces 9 of the subpixel regions 3 and the side faces of the subpixel regions 3.

On the transparent conductive layer 13 metallic conductive tracks 14 are in turn applied in each of the trenches 6 between the subpixel regions 3, the tracks 14 serving for external contacting of the subpixel regions 3.

It should be noted at this point that, although in the figures in each case only one pixel region 2 with three subpixel regions 3 is shown by way of example, the semiconductor body 1 does generally have a plurality of such pixel regions 2. The pixel regions 2 are here particularly preferably all of like configuration.

Figure 2:
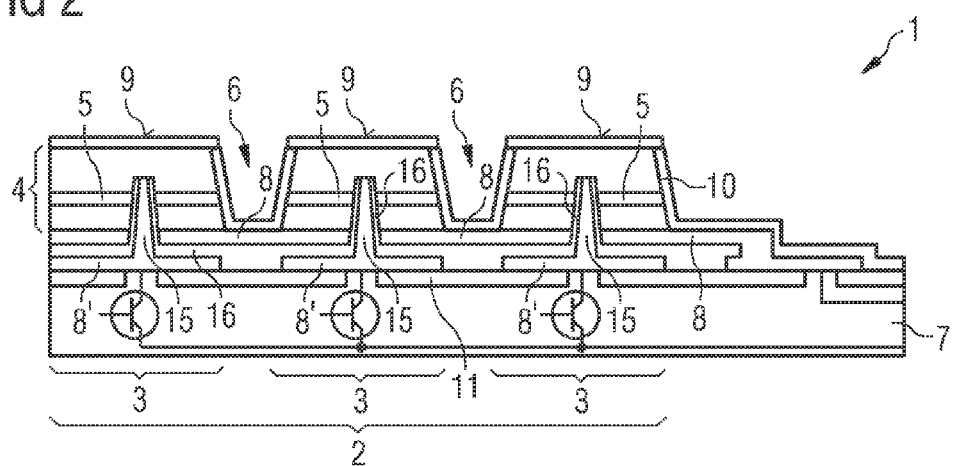

The semiconductor body 1 according to the exemplary embodiment of FIG. 2 likewise comprises one pixel region 2 with three different subpixel regions 3. Each subpixel region 3 comprises a semiconductor layer sequence 4 with an active layer 5 which is suitable for emitting electromagnetic radiation of a first wavelength range, preferably blue light. The subpixel regions 3 are in the present case again separated from one another by trenches 6, wherein the trenches 6 pass right through the active layer 5 and also the semiconductor layer sequence 4. The semiconductor body 1 again comprises a carrier element 7, as already described above. The carrier element 7 takes the form of an active matrix element, for example. Such an active matrix element for example comprises silicon or is formed of silicon.

As in the exemplary embodiment of FIG. 1, a specular layer 8 which is electrically conductive is applied between the carrier element 7 and the active semiconductor layer sequence 4.

In contrast to the semiconductor body 1 according to the exemplary embodiment of FIG. 1, however, a passivation layer 10 is formed over the entire surface of the front of the semiconductor body 1 according to the exemplary embodiment of FIG. 2. The passivation layer 10 is here formed by an electrically insulating material, such as for example an oxide or a nitride. In the present case, the passivation layer 10 completely covers the radiation exit face 9 of each subpixel region 3, the side faces of each subpixel region 3 and the bottom of the trenches 6 between the subpixel regions 3.

Since, in the case of the semiconductor body 1 according to the exemplary embodiment of FIG. 2, the radiation exit faces 9 of the subpixel regions 3 are formed by the electrically insulating material of the passivation layer 10, these subpixel regions 3 cannot be electrically contacted via their radiation exit faces 9. For this reason, a further metallic, electrically conductive layer 8', which has a through-via 15 through the active layer 5, is applied between the carrier element 7 and the specular layer 8. The through-via 15 serves in contacting the semiconductor layer sequence 4 electrically at the front. The further metallic layer 8' and the through-via 15 are separated from the specular layer 8, the active layer 5 and the region of the semiconductor layer sequence 4 which faces the carrier element 7 by an electrically insulating layer 16.

Figure 3:
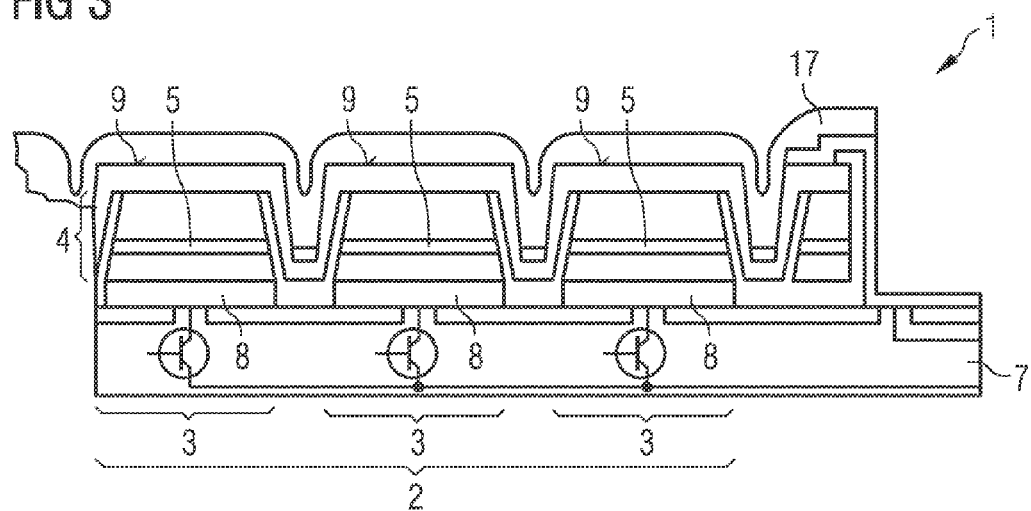
Figure 4:
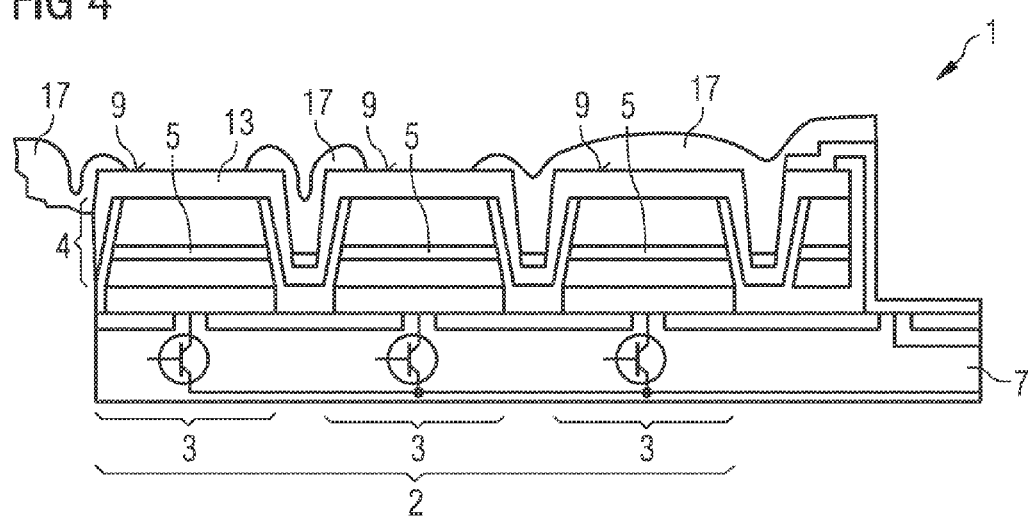

In the method according to the first exemplary embodiment of FIGS. 3 to 9, a semiconductor body 1 is provided as has already been described in detail with reference to FIG. 1. A photoresist layer 17 is applied over the entire surface of the front of the semiconductor body 1 (FIG. 3). By photopatterning of the photoresist layer 17, the radiation exit faces 9 of two subpixel regions 3 are exposed, while the radiation exit face 9 of the third subpixel region 3 is completely covered by the photoresist layer 17. The trench 6 between the two exposed subpixel regions 3 is also filled with the photoresist layer 17 (FIG. 4).

Figure 5:
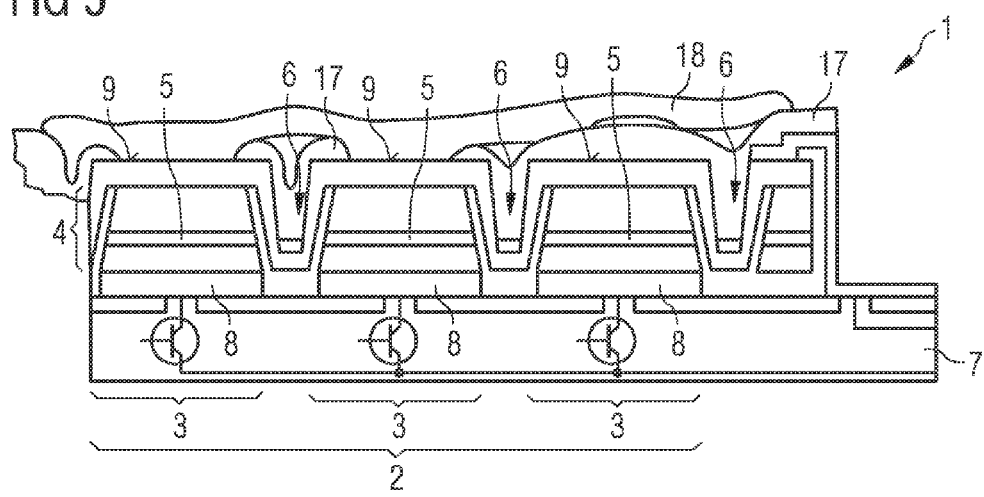

In a next step an electrically conductive layer 18 is applied over the entire surface of the front of the semiconductor body 1 (FIG. 5). The electrically conductive layer 18 is suitable at least in part for forming a salt with a protic reactant.

Figure 6:
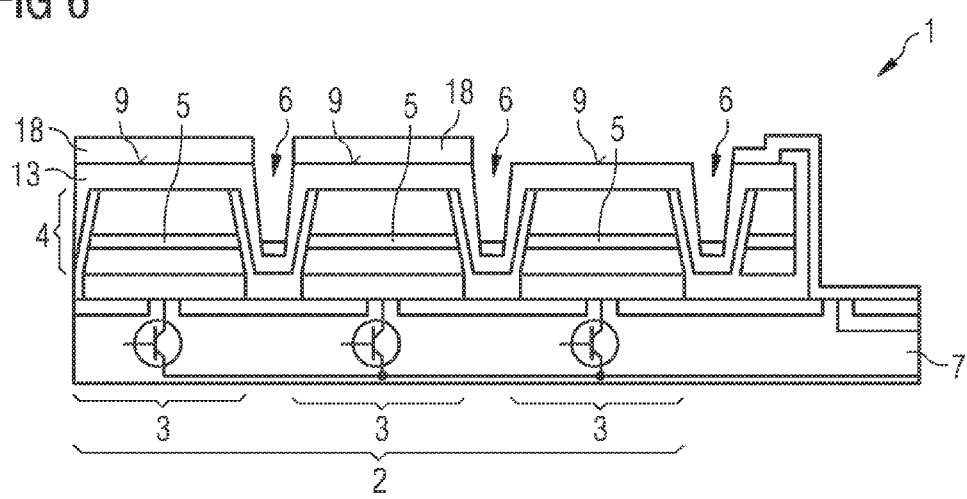

In a next step, which is illustrated schematically in FIG. 6, the patterned photoresist layer 17 is removed. An electrically conductive layer 18 is then located on the freely accessible radiation exit faces 9 of the subpixel regions 3. The radiation exit face 9 of the subpixel region 3, which was covered with the photoresist layer 17, is on the other hand freely accessible. The side faces of the semiconductor layer sequences 4 and the trenches 6 between the subpixel regions 3 are also free of the electrically conductive layer 18. In other words, only the radiation exit faces 9 of two subpixel regions 3 are covered with the electrically conductive layer 18, while the remaining front of the pixel region 2 is free of the electrically conductive layer 18.

Figure 7:
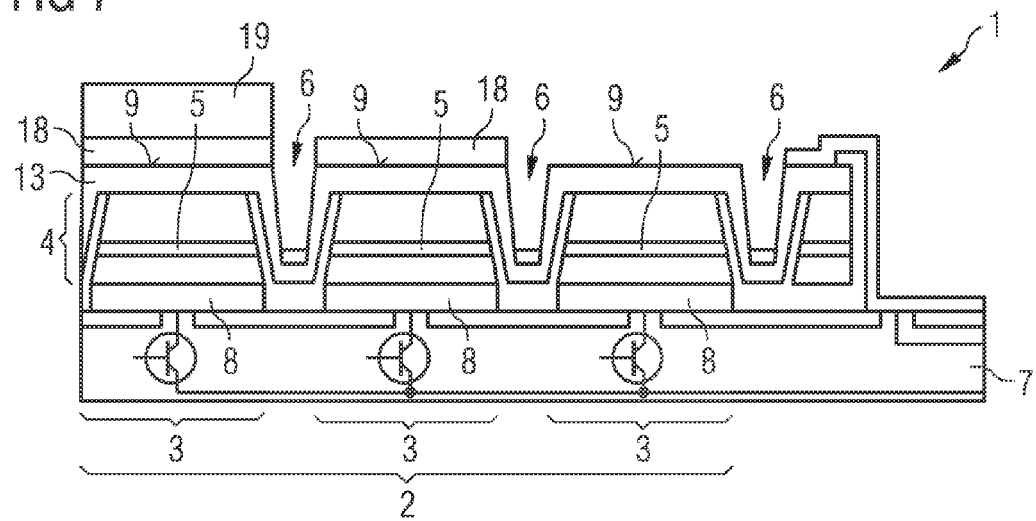

In a next step, a conversion layer 19 is deposited on the electrically conductive layer 18 of a subpixel region 3 using an electrophoresis process (FIG. 7). The conversion layer 19 is in this case suitable for converting electromagnetic radiation of the first wavelength range into electromagnetic radiation of a second wavelength range. The second wavelength range is here formed of green light. The conversion layer 19 is configured such that it converts the electromagnetic radiation, which is emitted by the radiation exit face 9 of the subpixel region 3, as completely as possible into green light.

In the electrophoretic deposition of the conversion layer 19, in this case only the subpixel region 3 on which it is intended to apply the conversion layer 19 is supplied with current. In this way, luminescent material particles only attach to this subpixel region 3 during the electrophoresis process.

Figure 8:
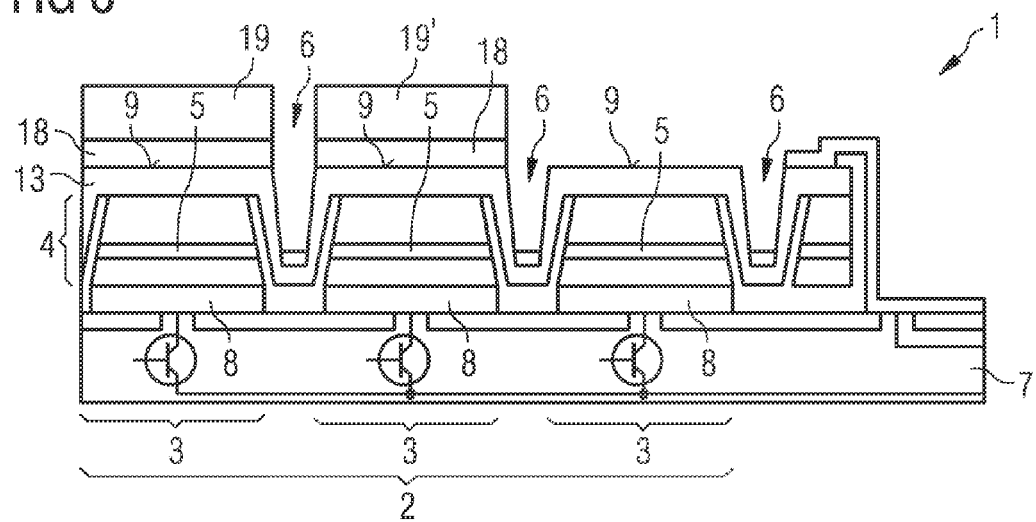

In a next step, a further conversion layer 19' is then applied to the further subpixel region 3, whose radiation exit face 9 is covered with an electrically conductive layer 18 (FIG. 8). The further conversion layer 19' is suitable for converting electromagnetic radiation of the first wavelength range into electromagnetic radiation of a third wavelength range, which is different from the first and second wavelength ranges. The further conversion layer 19' is particularly preferably suitable for converting blue light, which is produced in the active layer, as completely as possible into red light.

Figure 9:
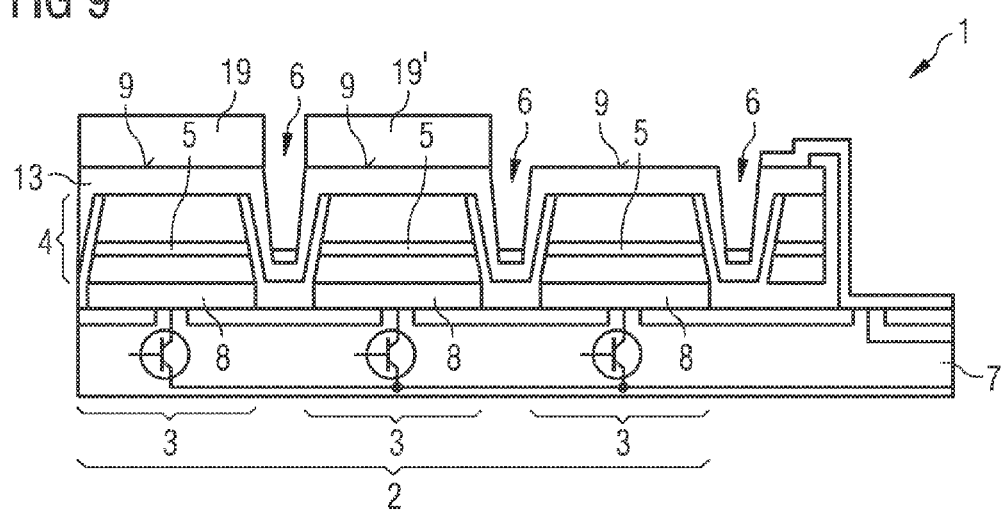

In a next step, the material of the electrically conductive layer is then dissolved out by introducing at least the electrically conductive layer into the protic reactant, such that the electrically conductive layer at least in part forms a salt with the protic reactant. In a further step the salt formed is washed out of the semiconductor chip (FIG. 9). In particular, the salt is removed from a surface of the semiconductor body 1 by washing out.

In the method according to FIGS. 3 to 9, a semiconductor body 1 is used whose subpixel regions 3 may be individually supplied with current. It is therefore possible to supply current to individual subpixel regions 3 in the electrophoresis process and in this way to deposit the conversion layer 19, 19' only on the subpixel regions 3 supplied with current. If it is not possible or not desired to supply the subpixel regions 3 individually with current, then prior to electrophoretic deposition of the conversion layer 19, 19' the region of the front of the semiconductor body 1 which it is not intended to provide with the conversion layer 19, 19' is in each case covered with a photoresist layer 17. Only the region of the front of the semiconductor body 1 to be coated remains freely accessible during the electrophoresis process.

Figure 10:
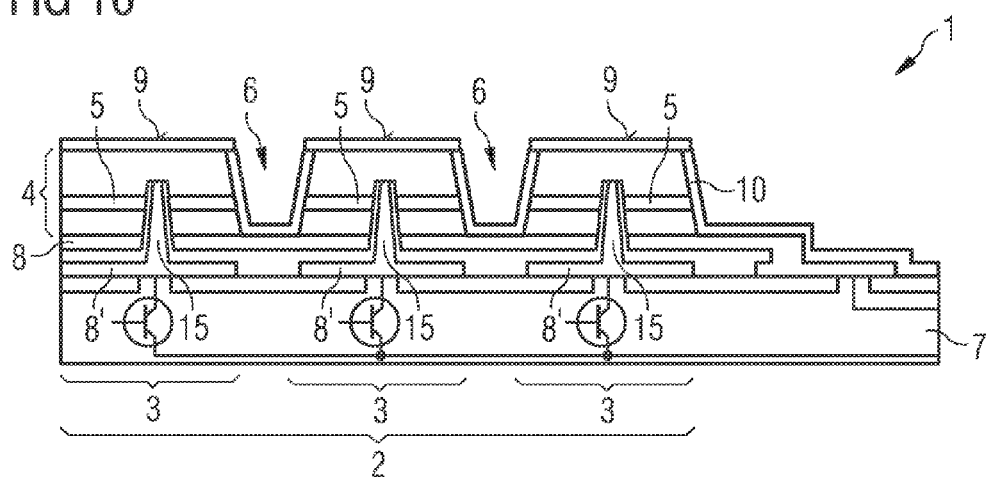
Figure 11:
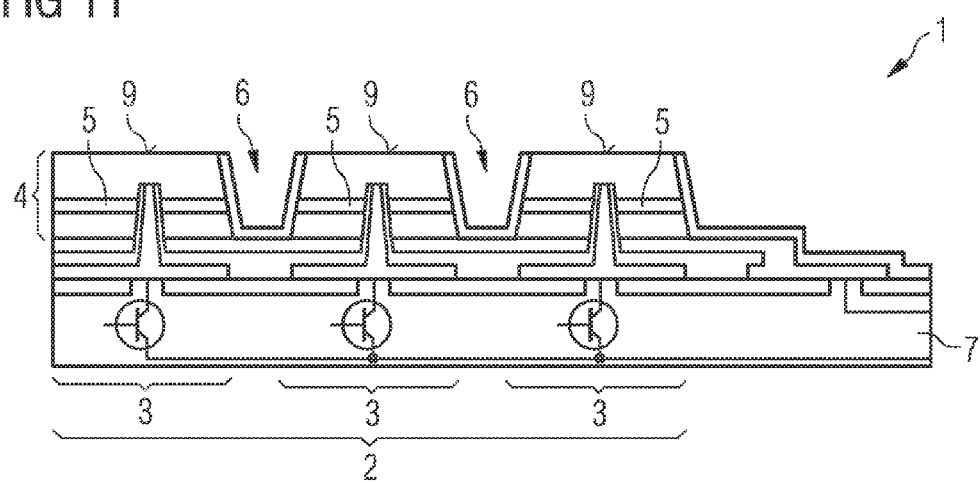

In the method according to the exemplary embodiment of FIGS. 10 and 11, in a first step a semiconductor body 1 is provided, as already described in detail with reference to FIG. 2 (FIG. 10). In a next step the passivation layer 10 is removed from the radiation exit face 9 of the subpixel regions 3 using a photolithographic method. In this way, the radiation exit faces 9 of the subpixel regions 3 are made electrically conductive (FIG. 11). If the subpixel regions 3 are individually energizable, then, as has already been described in detail with reference to FIGS. 3 to 9, two different conversion layers 19, 19' are applied onto the electrically conductive radiation exit faces 9 of two subpixel regions 3, while the radiation exit face 9 of one subpixel region 3 remains free of the conversion layers 19, 19' (not shown).

If it is impossible to supply the subpixel regions 3 individually with current, then only the subpixel regions to be coated are selectively exposed in succession and provided in accordance with the method according to FIGS. 3 to 9 in each case with a conversion layer 19, 19' (not shown).

Figure 12:
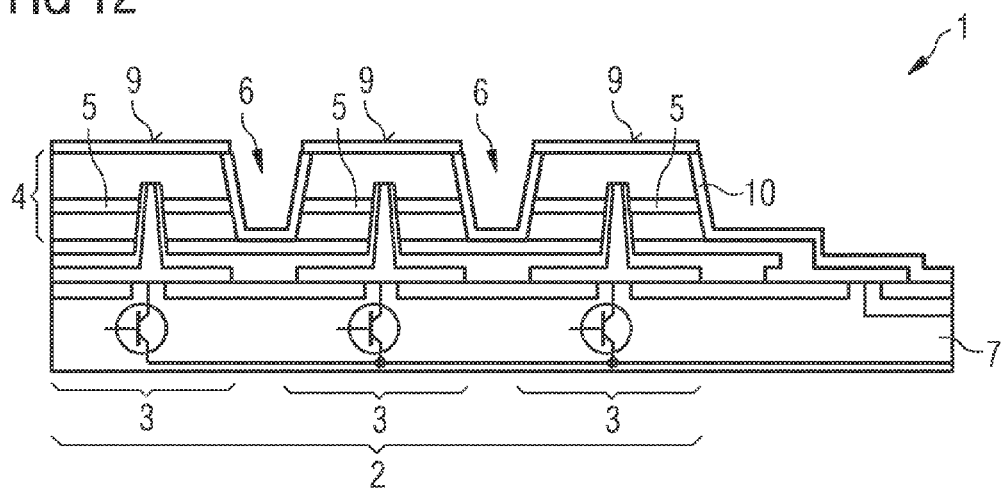

In the method according to the exemplary embodiment of FIGS. 12 to 19 a semiconductor body 1 is likewise provided, as has already been described in detail with reference to FIG. 2 (see FIG. 12). However, in contrast to the method according to FIGS. 10 and 11, in the case of this semiconductor body 1 it is intended that the passivation layer 10 be retained completely on the semiconductor body 1.

Figure 13:
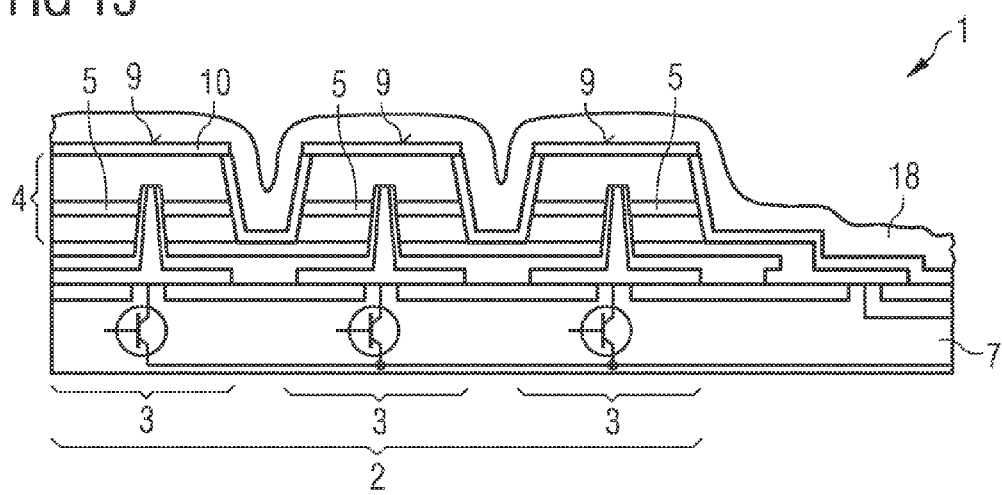

In a first step, an electrically conductive layer 18 which is suitable at least in part for forming a salt with a protic reactant is applied over the entire surface of the front of the semiconductor body 1, which front comprises the radiation exit faces 9 of the subpixel regions 3 (FIG. 13).

Figure 14:
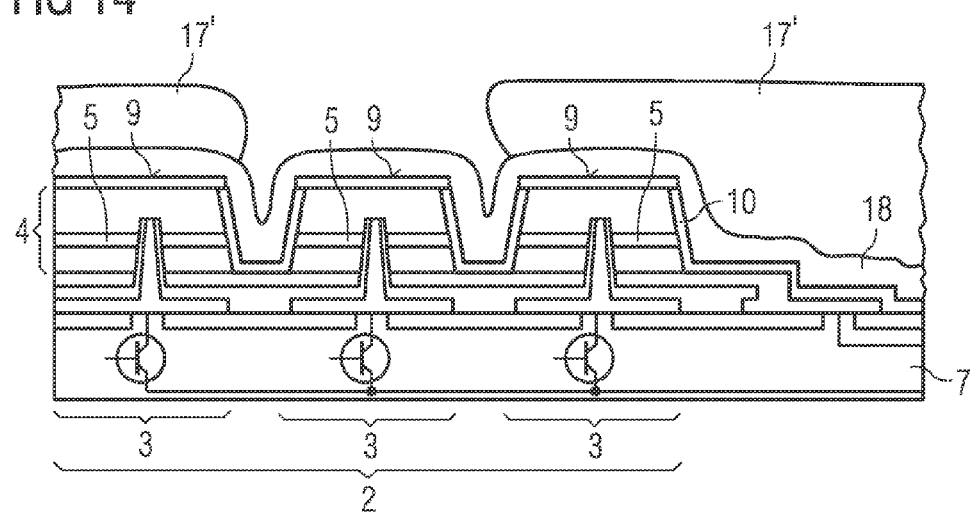

A patterned photoresist layer 17' is then applied onto the electrically conductive layer 18. The photoresist layer 17' covers two subpixel regions 3, while the electrically conductive layer 18 is freely accessible in a further subpixel region 3 (FIG. 14).

Figure 15:
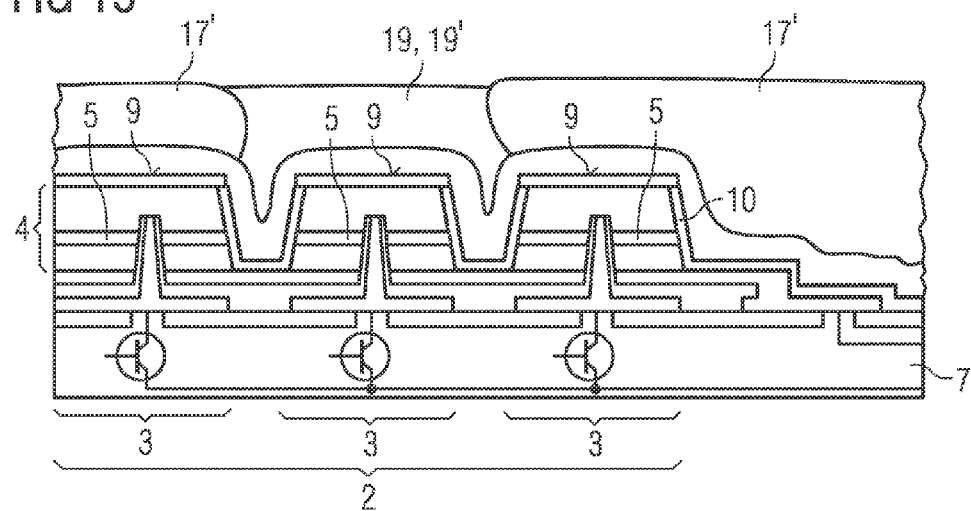

A conversion layer 19 is then deposited using an electrophoresis process in the region in which the electrically conductive layer 18 is freely accessible (FIG. 15). For the electrophoresis process, the electrically conductive layer 18 is in each case contacted laterally of the semiconductor body 1 (not shown).

Figure 16:
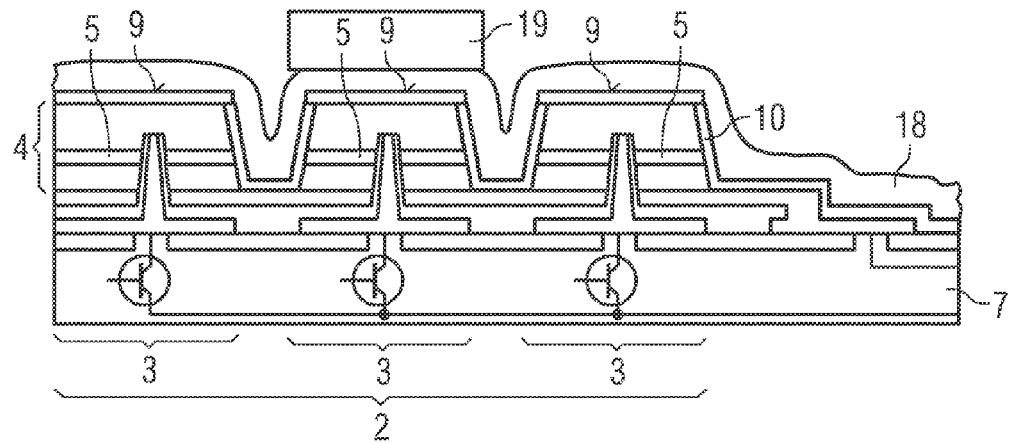
Figure 17:
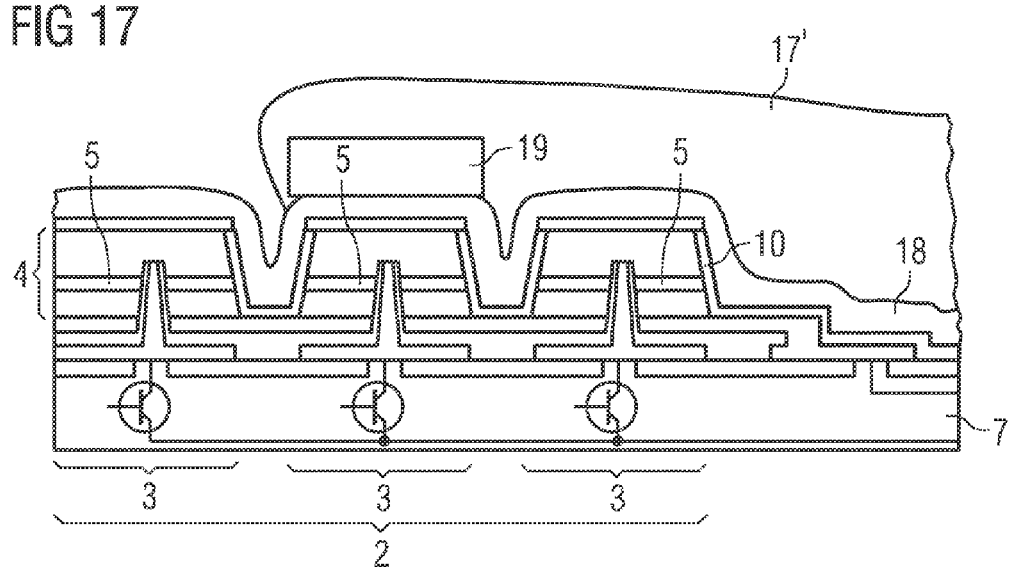

In a next step the photoresist layer 17' is removed again (FIG. 16). On the radiation exit face 9 of one of the subpixel regions 3, a conversion layer 19 is then arranged, while the other subpixel regions 3 are free of the conversion layer 19 (FIG. 16).

A patterned photoresist layer 17' is then applied again, which covers the conversion layer 19 already applied and one of the directly adjacent subpixel regions 3. Only one subpixel region 3 is freely accessible (FIG. 16).

Figure 18:
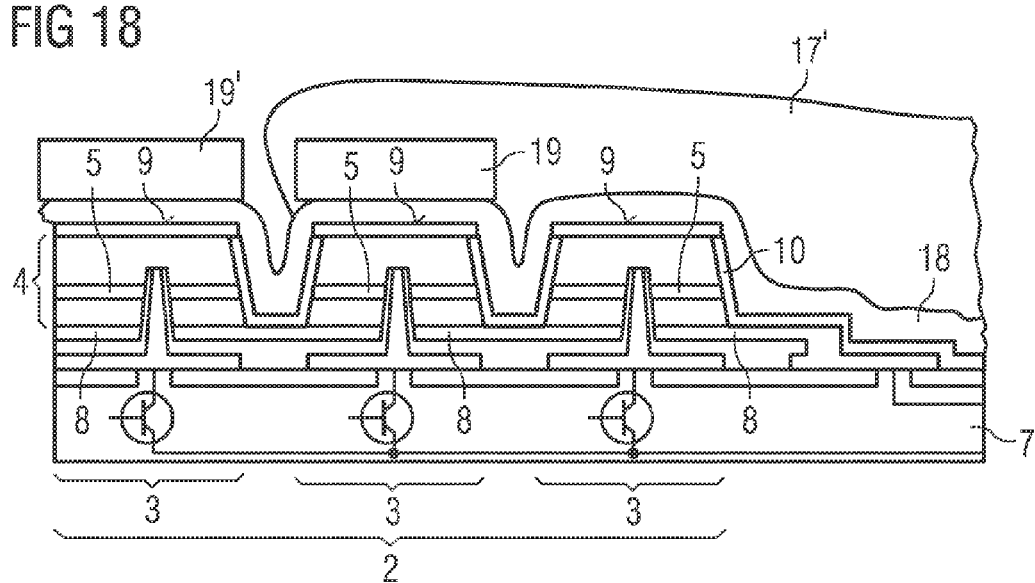

Then an electrophoresis process is again carried out, to deposit a further conversion layer 19' on the electrically conductive layer 18 over the radiation exit face 9 of the freely accessible subpixel region 3 (FIG. 18).

Figure 19:
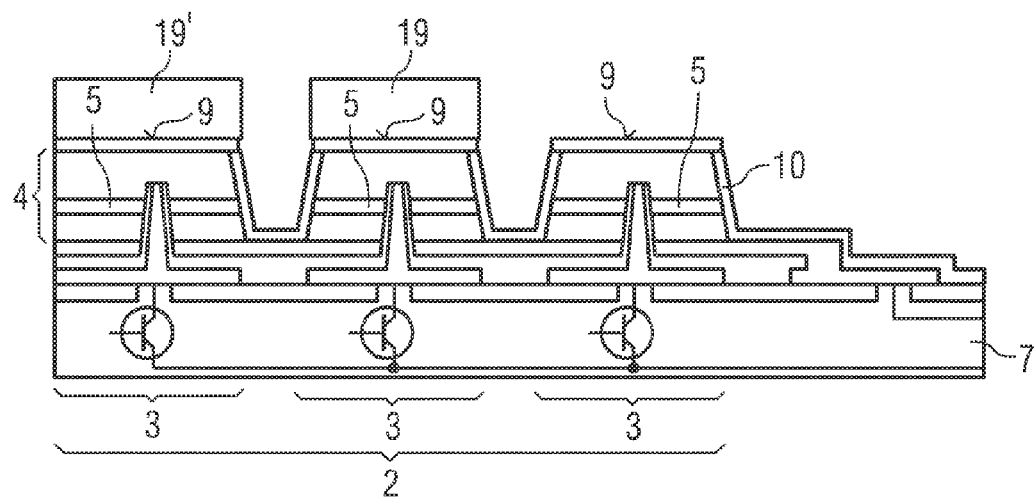

In a further step, the photoresist layer 17' is firstly removed and then the semiconductor body 1 is introduced into a protic reactant, such that the electrically conductive layer 18 is also converted into a salt and then washed out (FIG. 19).

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing an optoelectronic semiconductor chip, the method comprising:
   providing a semiconductor body with a pixel region comprising different subpixel regions, each subpixel region having a radiation exit face, wherein the subpixel regions are electrically insulated from one another and each subpixel region comprises an active layer that is suitable for emitting electromagnetic radiation of a first wavelength range;
   applying an electrically conductive layer onto the radiation exit face of a subpixel region, wherein the electrically conductive layer is suitable at least in part for forming a salt with a protic reactant; and depositing a conversion layer on the electrically conductive layer using an electrophoresis process.

2. The method according to claim 1,
wherein the radiation exit face of each subpixel region is located at a front surface of the semiconductor body,
wherein the radiation exit face of each subpixel region is electrically conductive,
wherein the electrically conductive layer is applied over the entire front surface of the semiconductor body, and
wherein a photoresist layer is applied onto the electrically conductive layer in at least one subpixel region, while the electrically conductive layer is freely accessible in a further subpixel region.

3. The method according to claim 2, wherein the electrically conductive layer is electrically contacted laterally during the electrophoresis process.

4. The method according to claim 1,
wherein the radiation exit face of each subpixel region is located at a front surface of the semiconductor body,
wherein the radiation exit face of each subpixel region is formed by a passivation layer,
wherein the electrically conductive layer is applied over the entire front surface of the semiconductor body, and
wherein a photoresist layer is applied onto the electrically conductive layer in at least one subpixel region, while the electrically conductive layer is freely accessible in a further subpixel region.

5. The method according to claim 1,
wherein a radiation exit face of each subpixel region is formed by a passivation layer, and
wherein the passivation layer is removed from the radiation exit face of at least one subpixel region, such that the radiation exit face of the subpixel region is made electrically conductive, while the passivation layer is retained in at least one subpixel region.

6. The method according to claim 5,
wherein the passivation layer is removed in a further subpixel region, such that the radiation exit face of the further subpixel region is made electrically conductive,
wherein the electrically conductive layer is applied onto the radiation exit face of the further subpixel region, and
wherein a further conversion layer is deposited on the electrically conductive layer using an electrophoresis process.

7. The method according to claim 1,
wherein the radiation exit face of each subpixel region is electrically conductive, and
wherein using the electrophoresis process comprises supplying current to the subpixel region onto which the conversion layer is applied, the current being supplied independently of another subpixel region.

8. The method according to claim 7, wherein the electrically conductive radiation exit face of the subpixel regions is formed by a transparent electrically conductive layer, which comprises a TCO material.

9. The method according to claim 7, wherein the electrically conductive radiation exit face is produced by removal of a passivation layer overlying the subpixel region.

10. The method according to claim 1,
wherein the pixel region comprises precisely three subpixel regions,
wherein a first subpixel region remains free of a conversion layer,
wherein a second subpixel region is provided with the conversion layer, the conversion layer being suitable for converting radiation of a first wavelength range into radiation of a second wavelength range, and
wherein a third subpixel region is provided with a further conversion layer, the further conversion layer being suitable for converting radiation of the first wavelength range into radiation of a third wavelength range different from the first and second wavelength ranges.

11. The method according to claim 10, wherein the first wavelength range comprises blue light, the second wavelength range comprises green light and the third wavelength range comprises red light.

12. The method according to claim 1, wherein the electrically conductive layer is introduced into the protic reactant, such that the electrically conductive layer at least in part forms a salt with the protic reactant.

13. The method according to claim 12, wherein at least part of the salt is washed out of the optoelectronic semiconductor chip.

14. The method according to claim 1, wherein the electrically conductive layer comprises a material selected from the group consisting of lithium, sodium, potassium, rubidium, caesium, beryllium, calcium, magnesium, strontium, barium, scandium, titanium, aluminum, silicon, gallium, tin, zirconium, zinc oxide, zinc sulfide, zinc selenide, zinc telluride or tin oxide.

15. The method according to claim 1, wherein the deposited conversion layer comprises pores.

16. A method for producing an optoelectronic semiconductor chip, the method comprising:
providing a semiconductor body with a pixel region comprising a plurality of different subpixel regions, each subpixel region having a radiation exit face;
applying an electrically conductive layer onto the radiation exit face of at least one subpixel region, wherein the electrically conductive layer is suitable at least in part for forming a salt with a protic reactant;
depositing a conversion layer on the electrically conductive layer using an electrophoresis process; and
introducing the protic reactant in fluid or gaseous form through pores such that the electrically conductive layer forms at least partially a salt with the protic reactant.

17. The method according to claim 16,
wherein the radiation exit face of each subpixel region is electrically conductive, and
wherein using the electrophoresis process comprises supplying current to the subpixel region onto which the conversion layer is applied, the current being supplied independently of another subpixel region.

18. The method according to claim 17, wherein the electrically conductive radiation exit face of the subpixel regions is formed by a transparent electrically conductive layer, which comprises a TCO material.

19. The method according to claim 17, wherein the electrically conductive radiation exit face is produced by removal of a passivation layer overlying the subpixel region.

20. A method for producing an optoelectronic semiconductor chip, the method comprising:
providing a semiconductor body with a pixel region comprising different subpixel regions, each subpixel region having a radiation exit face,
applying an electrically conductive layer onto the radiation exit face of a subpixel region, wherein the electrically conductive layer is suitable at least in part for forming a salt with a protic reactant; and
depositing a conversion layer on the electrically conductive layer using an electrophoresis process, wherein the pixel region comprises precisely three subpixel regions, wherein a first subpixel region remains free of a conversion layer, wherein a second subpixel region is provided with the conversion layer, the conversion layer being suitable for converting radiation of a first wavelength range into radiation of a second wavelength range, and wherein a third subpixel region is provided with a further conversion layer, the further conversion layer being suitable for converting radiation of the first wavelength range into radiation of a third wavelength range different from the first and second wavelength ranges.

* * * * *

UNITED STATES PATENT AND TRADEMARK OFFICE
CERTIFICATE OF CORRECTION

PATENT NO. : 9,985,011 B2
APPLICATION NO. : 14/912382
DATED : May 29, 2018
INVENTOR(S) : Britta Goeoetz Page 1 of 1

It is certified that error appears in the above-identified patent and that said Letters Patent is hereby corrected as shown below:

In Column 10, Lines 66-67, Claim 1, delete "conductive layer is suitable at least in part for forming a salt with a protic reactant;" and insert --conductive layer of a material M is suitable at least in part for forming a salt with a protic reactant of the general formula ROH according to M+ROH->4M(OR)+H$_2$;--.

In Column 12, Lines 35-36, Claim 16, delete "conductive layer is suitable at least in part for forming a salt with a protic reactant;" and insert --conductive layer of a material M is suitable at least in part for forming a salt with a protic reactant of the general formula ROH according to M+ROH->4M(OR)+H$_2$;--.

In Column 12, Lines 64-65, Claim 20, delete "conductive layer is suitable at least in part for forming a salt with a protic reactant;" and insert --conductive layer of a material M is suitable at least in part for forming a salt with a protic reactant of the general formula ROH according to M+ROH->4M(OR)+H$_2$;--.

Signed and Sealed this
Thirty-first Day of July, 2018

Andrei Iancu
*Director of the United States Patent and Trademark Office*